United States Patent
Lee

(10) Patent No.: US 10,762,012 B2
(45) Date of Patent: Sep. 1, 2020

(54) MEMORY SYSTEM FOR SHARING A PLURALITY OF MEMORIES THROUGH A SHARED CHANNEL

(71) Applicant: SK hynix Inc., Icheon (KR)

(72) Inventor: Dong Uk Lee, Seoul (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/352,676

(22) Filed: Mar. 13, 2019

(65) Prior Publication Data

US 2020/0174952 A1 Jun. 4, 2020

(30) Foreign Application Priority Data

Nov. 30, 2018 (KR) .................. 10-2018-0152528

(51) Int. Cl.
*G06F 13/16* (2006.01)
*H01L 25/00* (2006.01)
*G06F 9/54* (2006.01)

(52) U.S. Cl.
CPC .......... *G06F 13/1673* (2013.01); *G06F 9/544* (2013.01); *G06F 13/1657* (2013.01); *H01L 25/00* (2013.01); *H01L 2225/06541* (2013.01)

(58) Field of Classification Search
CPC .. G06F 13/1673; G06F 9/544; G06F 13/1657; H01L 25/00
See application file for complete search history.

(56) References Cited

U.S. PATENT DOCUMENTS

| | | |
|---|---|---|
| 5,434,533 A | 7/1995 | Furutani |
| 5,717,884 A | 2/1998 | Gzym et al. |
| 7,206,902 B2 | 4/2007 | Hakura et al. |
| 7,606,982 B2 | 10/2009 | Hwang et al. |
| 8,095,738 B2 | 1/2012 | Benhase et al. |
| 8,200,911 B2 | 6/2012 | Jeong |
| 8,433,852 B2 | 4/2013 | Hu et al. |
| 8,792,511 B2 | 7/2014 | Raikar et al. |
| 8,819,390 B1 | 8/2014 | Sivasubramanian et al. |
| 9,218,285 B2 | 12/2015 | Udipi et al. |
| 9,432,298 B1* | 8/2016 | Smith ................. H04L 49/9057 |
| 9,612,975 B2 | 4/2017 | Li |
| 2005/0195635 A1 | 9/2005 | Conley et al. |
| 2006/0041723 A1 | 2/2006 | Hakura et al. |
| 2009/0089466 A1* | 4/2009 | Cunningham .......... H01L 23/48 710/100 |
| 2012/0311269 A1 | 12/2012 | Loh et al. |
| 2012/0317356 A1 | 12/2012 | Ignatowski |

(Continued)

FOREIGN PATENT DOCUMENTS

| | | |
|---|---|---|
| KR | 20140067740 | 6/2014 |
| KR | 20190074823 A | 6/2019 |

OTHER PUBLICATIONS

Somogyi, et al., "Spatio-Temporal Memory Streaming," ISCA, Proceedings of the 36th Annual International Symposium on Computer Architecture, 2009, pp. 12.

*Primary Examiner* — Tim T Vo
*Assistant Examiner* — Phong H Dang

(57) ABSTRACT

A memory system memory system includes a first chip configured to perform a first operation, a second chip configured to perform a second operation, and a stacked memory device including a stacked structure of a plurality of memories. The stacked memory device being configured to be accessed by the first chip and the second chip through a shared bus.

19 Claims, 7 Drawing Sheets

(56) References Cited

U.S. PATENT DOCUMENTS

| | | | |
|---|---|---|---|
| 2013/0262732 A1* | 10/2013 | Tanabata | G06F 13/28 |
| | | | 710/308 |
| 2014/0048947 A1* | 2/2014 | Lee | H01L 23/5384 |
| | | | 257/774 |
| 2014/0115225 A1 | 4/2014 | Chandrakar et al. | |
| 2014/0149694 A1 | 5/2014 | Lee et al. | |
| 2014/0176187 A1* | 6/2014 | Jayasena | G11C 29/70 |
| | | | 326/39 |
| 2014/0181417 A1* | 6/2014 | Loh | G06F 12/0828 |
| | | | 711/141 |
| 2014/0181458 A1* | 6/2014 | Loh | G06F 12/1027 |
| | | | 711/206 |
| 2014/0379995 A1 | 12/2014 | Kwon et al. | |
| 2015/0039968 A1 | 2/2015 | Orion | |
| 2016/0055089 A1 | 2/2016 | Kim et al. | |
| 2018/0129613 A1 | 5/2018 | Faldu et al. | |
| 2018/0276126 A1* | 9/2018 | Ito | G06F 12/0815 |
| 2018/0300265 A1* | 10/2018 | Roberts | G06F 13/161 |
| 2019/0042437 A1 | 2/2019 | Guim Bernat et al. | |

\* cited by examiner

MEMORY SYSTEM FOR SHARING A PLURALITY OF MEMORIES THROUGH A SHARED CHANNEL

CROSS-REFERENCE TO RELATED APPLICATION

This application claims priority under 35 U.S.C. § 119(a) to Korean patent application No. 10-2018-0152528, filed on Nov. 30, 2018, the disclosure of which is incorporated in its entirety by reference herein.

BACKGROUND

1. Technical Field

Embodiments of the present disclosure generally relate to a memory system, and more particularly to technology for a High Bandwidth Memory (HBM) (or HBM device).

2. Related Art

In recent times, various mobile communication terminals, for example, smartphones, tablet PCs, etc., have been widely used throughout the world. In addition, demand for a Social Network Service (SNS), a Machine to Machine (M2M) service, a sensor network, etc., is increasing. Therefore, an amount of data, a speed of creating data, and diversity of data are geometrically increasing. In order to process big data, a data processing rate of each memory is of importance and a high-capacity memory device and a high-capacity memory module are also desirable.

Therefore, a memory system includes a plurality of unified memory devices to increase storage capacity. For example, a server architecture of a cloud data center is changed to efficiently execute big-data applications.

In order to efficiently process big data, a pooled memory formed by unification (or combination) of a plurality of memories has recently been used. The pooled memory can provide large storage capacity and high bandwidth.

BRIEF SUMMARY OF THE INVENTION

Various embodiments of the present disclosure are directed to providing a memory system that substantially addresses one or more issues due to limitations and disadvantages of the related art.

Embodiments of the present disclosure relate to a memory system in which each memory includes a shared channel, such that a plurality of chips contained in the memory system may share the memory through the shared channel.

In accordance with an embodiment of the present disclosure, a memory system includes a first chip configured to perform a first operation, a second chip configured to perform a second operation, and a stacked memory device configured to include a stacked structure of a plurality of memories. The stacked memory device being configured to be accessed by the first chip and the second chip through a shared bus.

It is to be understood that both the foregoing general description and the following detailed description of the present disclosure are explanatory and are intended to provide further explanation of the disclosure as claimed.

BRIEF DESCRIPTION OF THE DRAWINGS

The above and other features and beneficial aspects of the present disclosure will become readily apparent with reference to the following detailed description when considered in conjunction with the accompanying drawings.

DESCRIPTION OF EMBODIMENTS

Reference will now be made in detail to embodiments of the present disclosure, examples of which are illustrated in the accompanying drawings. The same or like reference numbers refer to the same or like portions throughout the various drawings and embodiments of the present disclosure. Throughout the specification of the present disclosure, if it is assumed that a certain part is connected (or coupled) to another part, the term "connection or coupling" means that the certain part is directly connected (or coupled) to another part and/or is electrically connected (or coupled) to another part through the medium of a third party. Throughout the specification of the present disclosure, if it is assumed that a certain part includes a certain component, the term "comprising or including" means that a corresponding component may further include other components unless a specific meaning opposed to the corresponding component is written. As used in the specification and appended claims, the terms "a," "an," "one," "the," and other similar terms include both singular and plural forms, unless context clearly dictates otherwise. The terms used in the present disclosure are merely used to describe specific embodiments and are not intended to limit the present disclosure. A singular expression may include a plural expression unless otherwise stated in the context.

Figure 1:
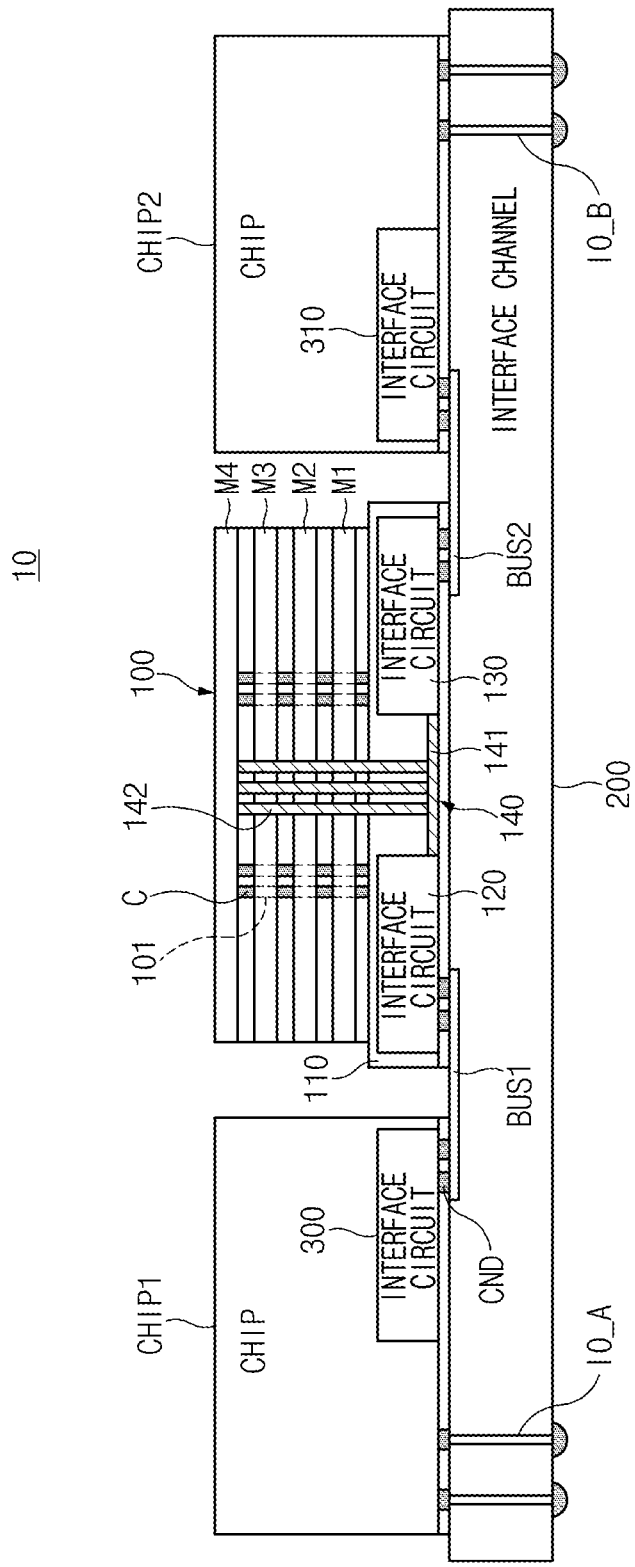
FIG. 1 illustrates a memory system according to an embodiment of the present disclosure.

FIG. 1 illustrates a memory system 10 according to an embodiment of the present disclosure.

Referring to FIG. 1, the memory system 10 may include a stacked memory (or a stacked memory device) 100, a plurality of chips (e.g., first and second chips CHIP1 and CHIP2), and an interface channel 200.

In this case, the stacked memory 100 may be disposed between the first chip CHIP1 and the second chip CHIP2, and may be shared by the first and second chips CHIP1 and CHIP2. Specifically, two chips (e.g., first chip CHIP1 and second chip CHIP2) may be combined to share a single stacked memory 100. In other embodiments, more than two chips (e.g., 3, 4 or more chips) may be combined to share the stacked memory 100.

The stacked memory 100 may be implemented as a packaged memory device in which a plurality of memories M1~M4 are stacked such that the plurality of memories M1~M4 may be integrated in a single memory device. Each of the memories M1~M4 may be selected from various memory device types, for example, Dynamic Random Access Memory (DRAM), Phase-Change Random Access Memory (PCRAM), Resistive Random Access Memory (ReRAM), flash memory, etc. In an embodiment, the memories M1~M4 comprise of the same memory types. In another embodiment, the memories M1~M4 do not comprise of the same memory types.

The memories M1~M4 may be coupled through at least one contact C. The memories M1~M4 may be electrically coupled through one or more Through Silicon Vias (TSVs) 101. The contacts C serve as contacts for corresponding TSVs 101.

In an embodiment, the TSVs 101 may be used to transmit a power-supply voltage to each of the memories M1~M4. For convenience of description and better understanding of the present disclosure, four memories M1~M4 may be stacked in the stacked memory 100 according to the embodiment shown in FIG. 1 of the present disclosure. However, embodiments of the present disclosure are not limited thereto, and the number of memories contained in the stacked memory 100 may vary.

The stacked memory 100 may be implemented as a High Bandwidth Memory (HBM) in which the memories M1~M4 are electrically coupled through the TSVs 101 so as to increase the number of input/output (I/O) units, resulting in an increased bandwidth.

The high bandwidth memory (HBM) may be a memory configured to have a higher bandwidth and higher density as compared to a conventional memory. For example, a plurality of memory chips may be stacked in the high bandwidth memory (HBM) using three-dimensional Through Silicon Via (3D-TSV) technology, and the high bandwidth memory (HBM) may include a large number of data pins to increase an input/output (I/O) bandwidth. The high bandwidth memory (HBM) may normally operate using the stacked memory chips and the large number of data pins.

A buffer layer 110 may be disposed between the plurality of memories M1~M4 and the interface channel 200. In an embodiment, the buffer layer 110 is provided below the memories M1~M4. The buffer layer 110 may include a shared bus 140 and interface circuits 120 and 130. In an embodiment, the buffer layer 110 may function as an interposer to electrically couple the memories M1~M4 to first and second buses BUS1 and BUS2 of an interface channel 200.

The interface circuit 120 of the buffer layer 110 may be coupled to the first bus BUS1 of the interface channel 200 through one or more contact nodes CND. Because the first bus BUS1 is electrically coupled to the first chip CHIP1, the interface circuit 120 may be electrically coupled to the first chip CHIP1 through the first bus BUS1. The interface circuit 130 of the buffer layer 110 may be coupled to the second bus BUS2 of the interface channel 200 through one or more contact nodes CND. Because the second bus BUS2 is electrically coupled to the second chip CHIP2, the interface circuit 130 may be electrically coupled to the second chip CHIP2 through the second bus BUS2.

In an embodiment, the interface circuit 120 of the buffer layer 110 may include a physical layer (PHY) for electrically coupling the stacked memory 100 to the first chip CHIP1 such that the stacked memory 100 may exchange signals with the first chip CHIP1 through the interface circuit 120. The interface circuit 130 of the buffer layer 110 may include a physical layer (PHY) for electrically coupling the stacked memory 100 to the second chip CHIP2, such that the stacked memory 100 may exchange signals with the second chip CHIP2 through the interface circuit 130.

The shared bus 140 may be coupled between the interface circuits 120 and 130 and the memories M1~M4. The shared bus 140 may transmit signals that have been received through the interface circuits 120 and 130 to the memories M1~M4. The shared bus 140 may transmit signals that have been received from the memories M1~M4 to the first and second chips CHIP1 and CHIP2 through the interface circuits 120 and 130, respectively. In an embodiment, the shared bus 140 may be used to transmit at least one signal to each of the memories M1~M4.

The shared bus 140 may include a horizontal bus 141 disposed between the two interface circuits 120 and 130, and a vertical bus 142 including a plurality of lines each extending in a first direction substantially perpendicular to the horizontal bus 141. The horizontal bus 141 may be shared by two interface circuits 120 and 130.

For electrical coupling between the two interface circuits 120 and 130, the horizontal bus 141 may include a line extending in a second direction (e.g., a horizontal direction in FIG. 1) that crosses the first direction. For example, the second direction may be substantially perpendicular to the first direction and substantially parallel to a top surface of the interface channel 200. For electrical coupling between the horizontal bus 141 and each of the memories M1~M4, the vertical bus 142 may include the plurality of lines each extending in the second direction (e.g., a vertical direction in FIG. 1). In the embodiment shown in FIG. 1, the shared bus 140 may have an inverted T-shape resulting from the shapes of the horizontal bus 141 and the vertical bus 142.

In an embodiment, the vertical bus 142 may include the plurality of lines each having an integrated line shape. For example, each of the plurality of lines of the vertical buses 142 may be a single body and have a line shape, such that each of the plurality of lines is coupled to a bottom surface of the uppermost memory M4 and passes through the remaining memories M1~M3. The plurality of lines of the vertical bus 142 (e.g., three vertical lines in FIG. 1) may be arranged substantially parallel to each other and be disposed in a center region of the stacked memory 100.

Although the shared bus 140 according to the above-described embodiment includes the plurality of lines of the vertical bus 142 each having the integrated line shape for convenience of description and better understanding of the present disclosure, embodiments of the present disclosure are not limited thereto. In another embodiment, each of the plurality of lines of the vertical bus 142 may include one or more of TSVs (not shown) respectively formed through one or more of the memories M1~M4 and one or more contacts (not shown) each coupling adjacent TSVs.

The first chip CHIP1 may exchange signals with the stacked memory 100 through the first bus BUS1. In the embodiment shown in FIG. 1, the first chip CHIP1 may be implemented as a processor such as a Central Processing Unit (CPU).

The first chip CHIP1 according to the above-described embodiment is implemented as a CPU for convenience of description and better understanding of the present disclosure. However, embodiments of the present disclosure are not limited thereto.

In addition, the first chip CHIP1 may include an interface circuit 300 to exchange signals with the stacked memory 100. The interface circuit 300 may be coupled to the first bus BUS1 through one or more contact nodes CND. The first bus BUS1 is coupled to the interface circuit 120 of the stacked memory 100, and thus the interface circuit 300 of the first chip CHIP1 may be electrically coupled to the interface circuit 120 of the stacked memory 100 through the bus BUS1.

The interface circuit 300 of the first chip CHIP1 may include a circuit structure (for example, a physical layer PHY) to perform memory interfacing between the first chip CHIP1 and the stacked memory 100.

The second chip CHIP2 may exchange signals with the stacked memory 100 through the second bus BUS2. In an embodiment, the second chip CHIP2 may be implemented as a System on Chip (SoC). In the embodiment shown in FIG. 1, the second chip CHIP2 may be implemented as a processor, for example, a Graphics Processing Unit (GPU) or an accelerator.

The second chip CHIP2 according to the above-described embodiment is implemented as a GPU or accelerator for convenience of description and better understanding of the present disclosure. However, embodiments of the present disclosure are not limited thereto, e.g., the second chip CHIP2 may a CPU or the same type of chip as the first chip CHIP1.

The second chip CHIP2 may include an interface circuit 310 to exchange signals with the stacked memory 100. The interface circuit 310 of the second chip CHIP2 may be coupled to the second bus BUS2 through one or more contact nodes CND. The second bus BUS2 is coupled to the interface circuit 130 of the stacked memory 100, and thus the interface circuit 310 of the second chip CHIP2 may be electrically coupled to the interface circuit 130 of the stacked memory 100 through the second bus BUS2.

The interface circuit 310 of the second chip CHIP2 may include a circuit structure (for example, a physical layer PHY) to perform memory interfacing between the second chip CHIP2 and the stacked memory 100.

The interface channel 200 may be disposed below the first and second chips CHIP1 and CHIP2 and the stacked memory 100. The interface channel 200 may be an interposer channel to exchange signals between the stacked memory 100 and the chips CHIP1 and CHIP2.

The interface channel 200 may include of the first and second buses BUS1 and BUS2 and first and second input/output (I/O) buses IO_A and IO_B. The first bus BUS1 may couple the interface circuit 300 of the first chip CHIP1 and the interface circuit 120 of the stacked memory 100 through corresponding contact nodes CND. The second bus BUS2 may couple the interface circuit 310 of the second chip CHIP2 and the interface circuit 130 of the stacked memory 100 through corresponding contact nodes CND. In an embodiment, each of the first and second buses BUS1 and BUS2 may be an interposer channel through which a corresponding pair of the interface circuits 300, 120, 130, and 310 are electrically coupled to each another.

The first I/O bus IO_A may be a bus through which the first chip CHIP1 is coupled to an external device (e.g., an external chip). The second I/O bus IO_B may be a bus through which the second chip CHIP2 is coupled to an external device (e.g., an external chip).

In a conventional memory system where a plurality of memories are coupled to a plurality of chips on a one to one basis, it is necessary for each of the plurality of chips to include an additional memory for data transmission therefrom. In this case, since the conventional memory system does not include a channel through which the respective memories are coupled to each other during data transmission of each memory, the conventional memory system must allow data of each memory to pass through different chips every data transmission, resulting in reduction in data transmission efficiency.

For example, in a conventional memory system, a plurality of memories are coupled to a plurality of chips, respectively, and two or more chips are coupled to each other through I/O buses. When data is transmitted from a first memory to a second memory, because the first memory and the second memory is not directly coupled through a channel, the data is transmitted from the first memory to a first chip coupled to the first memory, transmitted from the first chip to a second chip coupled to the second memory through one or more I/O buses, and then transmitted from the second chip to the second memory.

In contrast, according to an embodiment of the present disclosure, multiple chips (e.g., the first and second chips CHIP1 and CHIP2 in FIG. 1) are configured to share the stacked memory 100 through the shared bus 140 of the stacked memory 100, and thus the multiple chips may share data stored in the stacked memory 100. In addition, the shared bus 140 may directly transmit data between the first chip CHIP1 and the second chip CHIP2 without accessing the stacked memory 100. As a result, data transmission efficiency may be increased and power consumption caused by such data transmission may be reduced.

Figure 2:
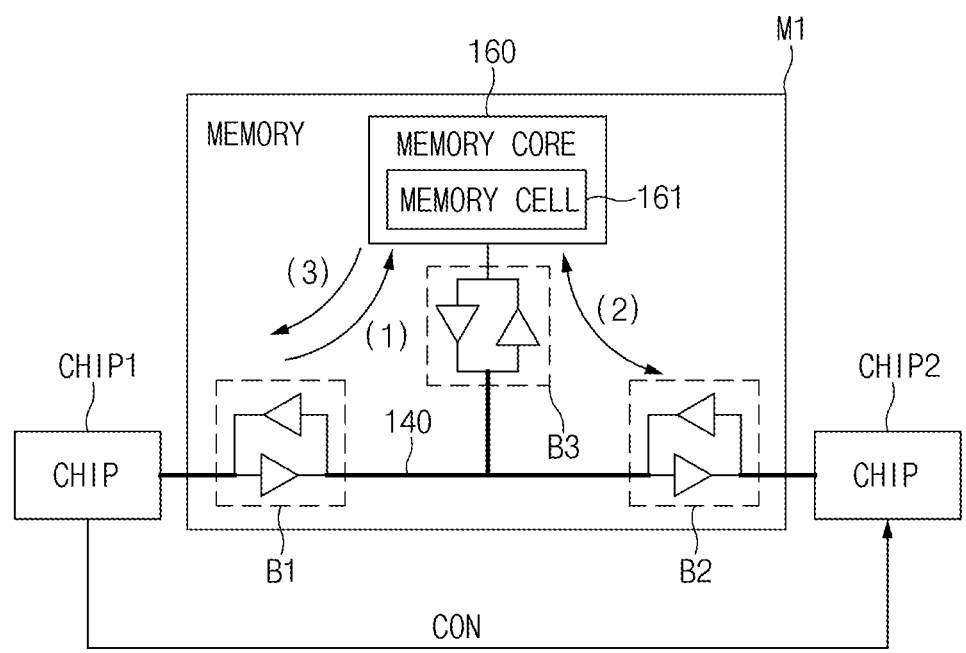
FIG. 2 illustrates a memory (or a memory device) shown in FIG. 1 according to an embodiment of the present disclosure.

FIG. 2 illustrates a memory M1 shown in FIG. 1 according to an embodiment of the present disclosure. Since the memories M1~M4 according to an embodiment of the present disclosure are substantially identical in structure to each other, a detailed structure of the memory M1 from among the memories M1~M4 will be described below for convenience of description and better understanding of the present disclosure, and descriptions for the remaining memories M2~M4 will be omitted for the interest of brevity. In addition, some of constituent elements of the memory M1 that are used for data transmission will hereinafter be described with reference to FIG. 2.

The memory M1 may include a shared bus 140, first, second, and third buffers B1, B2, and B3, and a memory core 160.

The first buffer B1 may buffer at least one signal received from a first chip CHIP1, and may transmit the buffered signal to the shared bus 140. In addition, the first buffer B1 may buffer at least one signal received from the shared bus 140, and may transmit the buffered signal to the first chip CHIP1.

The second buffer B2 may buffer at least one signal received from the second chip CHIP2, and may transmit the buffered signal to the shared bus 140. In addition, the second buffer B2 may buffer at least one signal received from the shared bus 140, and may transmit the buffered signal to the second chip CHIP2.

The third buffer B3 may buffer at least one signal applied to the shared bus 140, and may transmit the buffered signal to the memory core 160. In addition, the buffer B3 may buffer at least one signal received from the memory core 160, and may transmit the buffered signal to the shared bus 140.

In an embodiment, the first and second chips CHIP1 and CHIP2 may perform data communication with each other through the shared bus 140 without passing through the memory core 160. In an embodiment, addresses, commands, and control signals may also be communicated between the first chip CHIP1 and the second chip CHIP2 through the shared bus 140.

The memory core 160 may include not only a plurality of memory cells 161, each of which stores data therein, but also a plurality of circuits for performing one or more core operations of the memory cells 161.

In an embodiment, when a single stacked memory 100 is shared by the first and second chips CHIP1 and CHIP2, a time (or an access time) at which the first chip CHIP1 or the second CHIP starts to access the single stacked memory 100 may be controlled. For convenience of description and better understanding of the present disclosure, in the embodiment of FIG. 2, one chip (e.g., the first chip CHIP1) may have higher priority over the other chip (e.g., the second chip CHIP2), and the higher-priority chip CHIP1 may control an access time to the shared bus 140. In accordance with the embodiment shown in FIG. 2 of the present disclosure, the first chip CHIP1 may generate a control signal CON, and may transmit the generated control signal CON to the second chip CHIP2, thereby controlling an access time to the stacked memory 100.

For example, when the first chip CHIP1 gains access to the memory core 160, the first chip CHIP1 may transmit an activated (or enabled) control signal CON to the second chip CHIP2. The second chip CHIP2 may enter a standby mode in response to the activated control signal CON. After the first chip CHIP1 has completed an operation of accessing the memory core 160, the first chip CHIP1 may transmit a deactivated (or disabled) control signal CON to the second chip CHIP2. As a result, the second chip CHIP2 may perform an operation of accessing the memory core 160.

In an embodiment, the single stacked memory 100 is shared by the first chip CHIP1, the second chip CHIP2, and a third chip (not shown). The first chip CHIP1 may have higher priority over the second chip CHIP2, and the second chip CHIP2 may have higher priority over the third chip. For example, when the first chip CHIP1 accesses the memory core 160, the first chip CHIP1 may transmit an activated (or enabled) first control signal (not shown) to the second chip CHIP2 and the third chip. As a result, each of the second chip CHIP2 and the third chip may enter a standby mode in response to the activated first control signal. After the first chip CHIP1 has completed an operation of accessing the memory core 160, the first chip CHIP1 may transmit a deactivated (or disabled) first control signal to the second chip CHIP2 and third chip. When the second chip CHIP2 receives the deactivated first control signal from the first chip CHIP1, the second chip CHIP2 may access the memory core 160 and transmit an activated second control signal (not shown) to the third chip. As a result, the third chip may enter a standby mode in response to the activated second control signal. When the third chip receives the deactivated first control signal and a deactivated second control signal, the third chip may access the memory core 160.

Operations of the memory M1 shown in FIG. 2 are as follows.

First of all, upon receiving a command (e.g., a command for processing data written in an arbitrary address, and a processing type about the written data, etc.) from a host (not shown), the first chip CHIP1 may access the memory M1. The first buffer B1 may buffer data received from the first chip CHIP1, and the buffered data may be transmitted to the shared bus 140. The third buffer B3 may buffer data received through the shared bus 140, and the buffered data may be stored in a specific region (e.g., a common region 163 in FIG. 5) of the memory cell 161 after passing through a first route (1).

Thereafter, the second chip CHIP2 may read data (e.g., data written by the first chip CHIP1) stored in a specific region (e.g., the common region 163 in FIG. 5) of the memory cell 161, and may perform a computation operation on the read data. The second chip CHIP2 may store data in the memory core 160 during a write operation, and may read data stored in the memory core 160 during a read operation.

For example, data read from the memory cell 161 may be buffered by third and second buffers B3 and B2, the buffered data may be transmitted to the second chip CHIP2, and then processed by the second chip CHIP2. Data processed by the second chip CHIP2 may be buffered by the second buffer B2, and the buffered data may be transmitted to the shared bus 140. The third buffer B3 may buffer the transmitted data to the shared bus 140, and the buffered data may be stored in a specific region (e.g., a second chip allocation region 162 in FIG. 5) of the memory cell 161 through a second route (2).

Subsequently, the first chip CHIP1 may read data stored in a specific region (e.g., the second chip allocation region 162 in FIG. 5) of the memory cell 161 through a third route (3), may confirm the data processing result of the second chip CHIP2 based on the read data, and may perform other operations based on the confirmed result.

As described above, in a memory system (e.g., the memory system 10 in FIG. 1) according to an embodiment of the present disclosure, data communicated between the plurality of chips CHIP1 and CHIP2 may be processed within a stacked memory device (e.g., the stacked memory 100), resulting in increased efficiency in data transmission.

Figure 3:
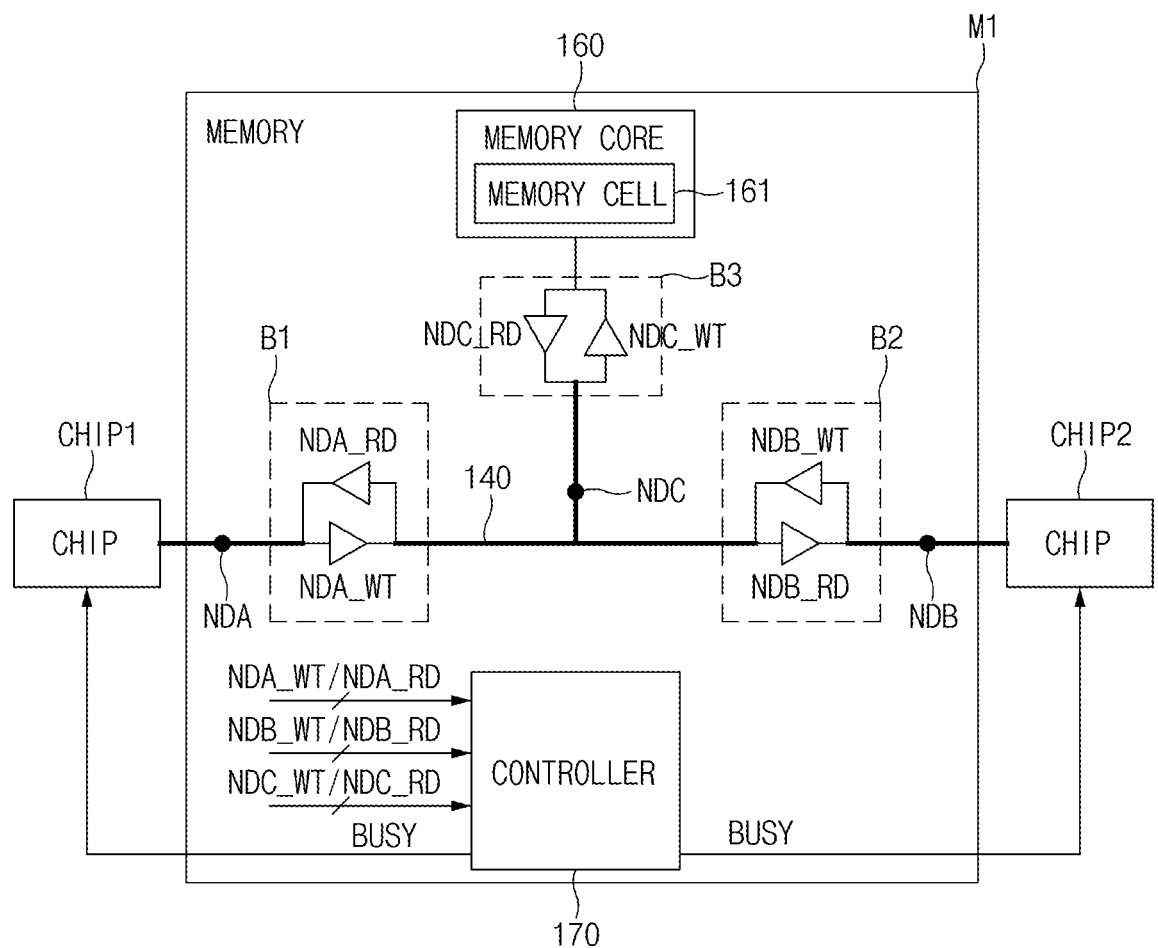
FIG. 3 illustrates a memory (or a memory device) shown in FIG. 1 according to an embodiment of the present disclosure.

FIG. 3 illustrates the memory M1 shown in FIG. 1 according to an embodiment of the present disclosure. The memory M1 shown in FIG. 3 may further include a controller 170 as compared to the memory M1 shown in FIG. 2.

Referring to FIG. 3, the controller 170 may adjust or control an access time at which either a first chip CHIP1 or a second chip CHIP2 starts to access the memory core 160. In other words, when a single stacked memory 100 is shared by the first and second chips CHIP1 and CHIP2, an interrupt may occur between the first and second chips CHIP1 and CHIP2, thereby resulting in an occurrence of data collision in the shared bus 140.

Therefore, during data communication between the memory core 160 and one of the chips CHIP1 and CHIP2, the controller 170 in FIG. 3 may determine an access state of the memory core 160, and the controller 170 may adjust or control an access time of one of the first and second chips CHIP1 and CHIP2 to the memory core 160 based on the determined access state of the memory core 160. In more detail, as can be seen from FIG. 3, the controller 170 may adjust or control an access time of one of the first and second chips CHIP1 and CHIP2 to the memory core 160.

In an embodiment, the controller 170 may detect an operation state of the memory core 160, and may output a busy signal (BUSY) to each of the chips CHIP1 and CHIP2, thereby adjusting or controlling an access time between the memory core 160 and one of the chips CHIP1 and CHIP2. When at least one of the buffers B1~B3 is in a write operation mode or in a read operation mode, the controller 170 may activate the busy signal BUSY.

For example, the controller 170 may receive a first write signal NDA_WT and a first read signal NDA_RD that are applied to a first node NDA between the first chip CHIP1 and the first buffer B1, may receive a second write signal NDB_WT and a second read signal NDB_RD that are applied to a second node NDB between the second chip CHIP2 and the second buffer B2, and may receive a third write signal NDC_WT and a third read signal NDC_RD that are applied to a third node NDC, such that the controller 170 may detect an operation state of the memory core 160 and may control the busy signal (BUSY).

Figure 4:
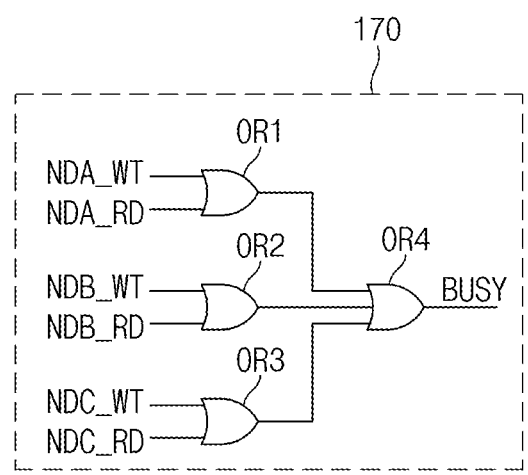
FIG. 4 illustrates a controller shown in FIG. 3 according to an embodiment of the present disclosure.

FIG. 4 illustrates the controller 170 shown in FIG. 3 according to an embodiment of the present disclosure.

Referring to FIG. 4, when one or more of the write signal and the read signal applied to each of the nodes NDA, NDB, and NDC of the stacked memory 100 is activated, the controller 170 may output a busy signal BUSY.

For example, when the busy signal BUSY is deactivated, it may be possible for each of the first and second chips CHIP1 and CHIP2 to access the memory core 160. In contrast, during a read operation or a write operation of the first chip CHIP1, the controller 170 may activate the busy signal BUSY. When the busy signal BUSY is activated, the second chip CHIP2 may determine that the first chip CHIP1 is accessing the memory core 160, and the chip CHIP2 may enter a standby mode without accessing the stacked memory 100. When the first chip CHIP1 receives the activated busy signal BUSY after the first chip CHIP1 has accessed the memory core 160, the first chip CHIP1 may continue to access the memory core 160.

In an embodiment, the controller 170 may include a plurality of logic circuits, for example, a plurality of OR gates OR1~OR4. The first OR gate OR1 may perform a logic OR operation on the first write signal NDA_WT and the first read signal NDA_RD. The second OR gate OR2 may perform a logic OR operation on the second write signal NDB_WT and the second read signal NDB_RD. The third OR gate OR3 may perform a logic OR operation on the write signal NDC_WT and the read signal NDC_RD. The fourth OR gate OR4 may generate a busy signal (BUSY) by performing a logic OR operation on output signals of the plurality of OR gates OR1~OR3.

Figure 5:
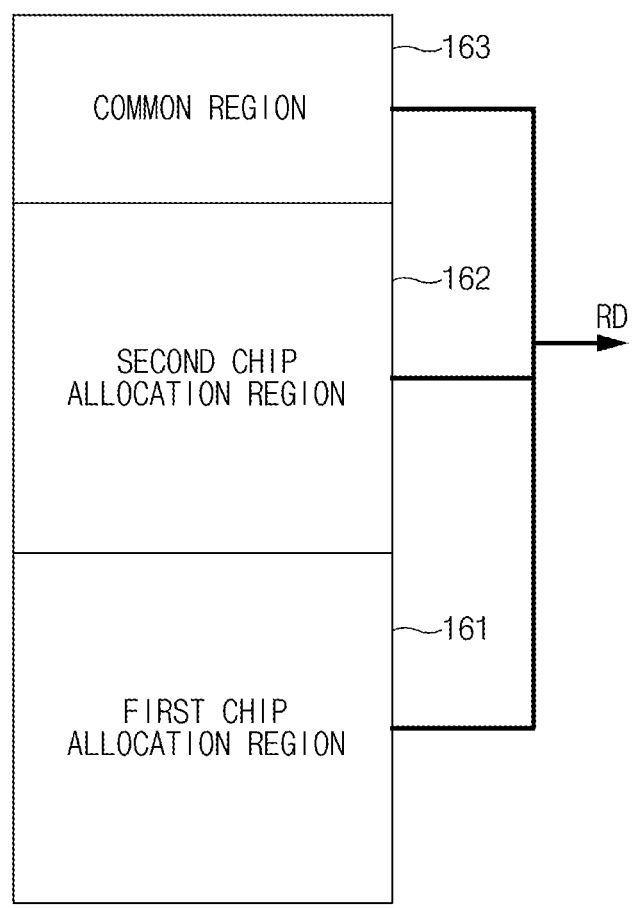
FIG. 5 illustrates a plurality of allocation regions of a memory core suitable for use in the memory shown in FIG. 2 according to an embodiment of the present disclosure.

FIG. 5 illustrates a plurality of allocation regions of the memory core 160 shown in FIG. 2 according to an embodiment of the present disclosure.

Referring to FIG. 5, the memory core 160 may store data received through the shared bus 140 during a write operation, or may output the stored data to the shared bus 140 during a read operation. During the write operation, the memory core 160 may identify a storage region for storing data using a row address, and may allocate data to the identified storage region. The memory core 160 may include a plurality of regions, for example, a first chip allocation region 161, a second chip allocation region 162, and a common region 163.

The memory core 160 may include the first chip allocation region 161 that stores data received from the first chip CHIP1. For example, the first chip allocation region 161 may be a memory region that is allocated to store data received from the first chip CHIP1, rather than from another chip (e.g., the second chip CHIP2).

The memory core 160 may include the second chip allocation region 162 that stores data received from the second chip CHIP2. For example, the second chip allocation region 162 may be a memory region that is allocated to store data received from the chip CHIP2, rather than from another chip (e.g., the first chip CHIP1).

In addition, the memory core 160 may include the common region 163 that stores not only data received from the first chip CHIP1 but also data received from the second chip CHIP2. The common region 163 may be a memory region that is commonly allocated to store data according to resources of two chips CHIP1 and CHIP2. In an embodiment, the common region 163 may include a first portion that stores data received from the first chip CHIP1 and a second portion that stores data received from the second chip CHIP2 and a ratio between the first portion and the second portion of the common region 163 may be dynamically adjusted.

The above-described embodiment of the present disclosure has disclosed that the storage region of the memory core 160 is divided into three division regions for convenience of description and better understanding of the present disclosure. However, embodiments of the present disclosure are not limited thereto, and one or more of the first chip allocation region 161, the second chip allocation region 162, and the common region 163 may be further divided into a plurality of division regions.

In a read operation of the memory M1, the respective chips CHIP1 and CHIP2 may read data RD from any of the first chip allocation region 161, the second chip allocation region 162, and the common region 163 in the memory core 160. In other words, during the read operation of the memory M1, a memory system including the first and second chips CHIP1 and CHIP2 may access all of the first chip allocation region 161, the second chip allocation region 162, and the common region 163 regardless of whether either the first chip CHIP1 or the second chip CHIP2 reads data RD from the memory core 160.

Figure 6:
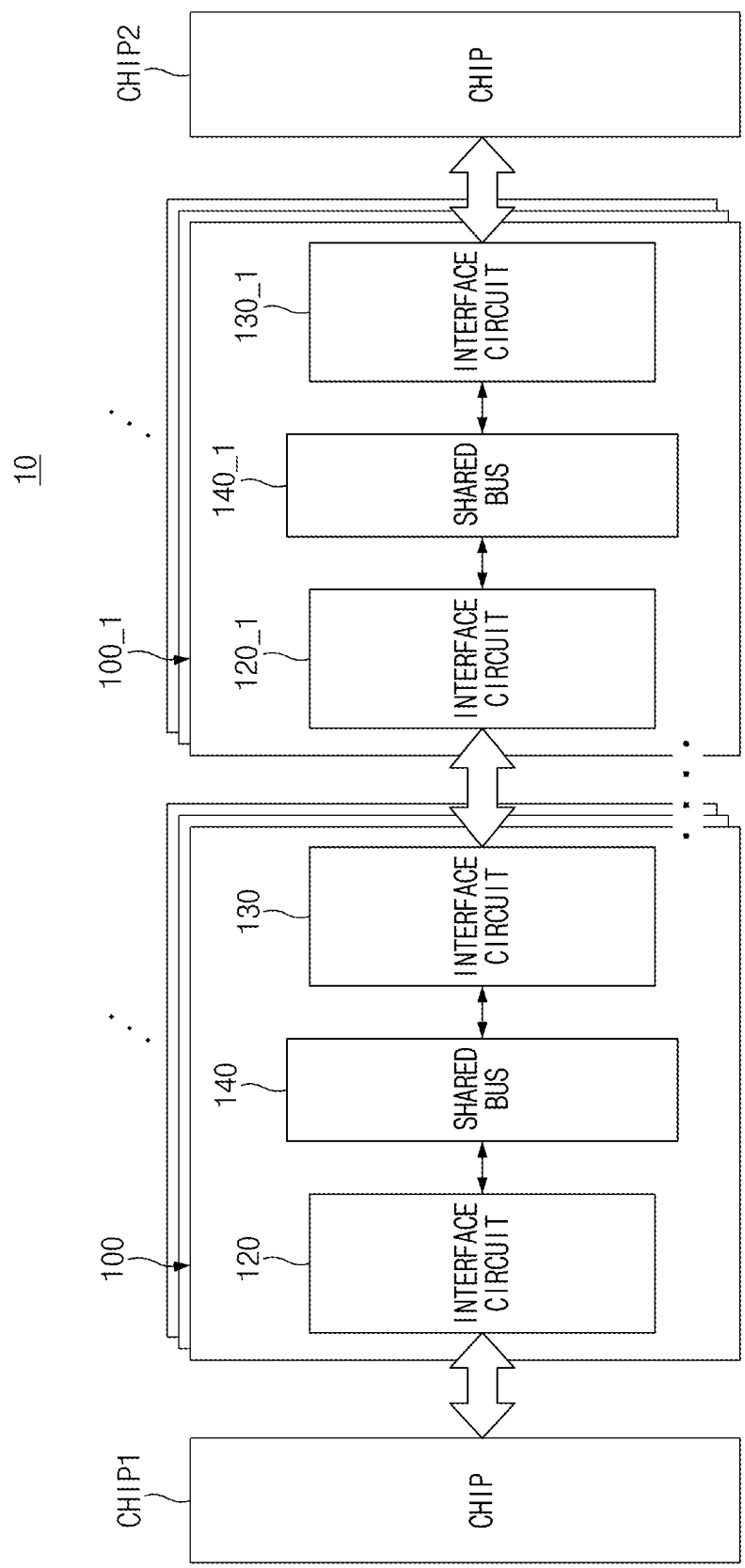
FIG. 6 illustrates a memory system according to another embodiment of the present disclosure.

FIG. 6 illustrates a memory system 10 according to another embodiment of the present disclosure.

The memory system 10 shown in FIG. 6 may include a plurality of stacked memories, for example, a first stacked memory 100 and a second stacked memory 100_1, whereas the memory system shown in FIG. 1 includes a single stacked memory 100. Each of the first stacked memory (or first stacked memory device) 100 and the second stacked memory device (or second stacked memory device) 100_1 includes a plurality of memories (e.g., the memories M1 to M4 in FIG. 1), one or more interface circuits, and a shared bus (e.g., the shared bus 140 in FIG. 1). The remaining constituent elements not shown in FIG. 6 are identical in structure to those of FIG. 1, and thus detailed descriptions thereof will herein be omitted for the interest of brevity.

The memory system 10 shown in FIG. 6 may include two stacked memories 100 and 100_1 disposed between the first and second chips CHIP1 and CHIP2 for convenience of description and better understanding of the present disclosure. However, embodiments of the present disclosure are not limited thereto, and three or more stacked memories may also be disposed between the first and second chips CHIP1 and CHIP2.

The first chip CHIP1 and the first stacked memory 100 may be coupled to each other through an interface circuit 120. The first stacked memory 100 may be coupled to each of interface circuits 120 and 130 through a first shared bus 140 embedded therein. The interface circuit 130 of the first stacked memory 100 may be coupled to an interface circuit 120_1 of the second stacked memory 100_1 neighboring the first stacked memory 100.

The second chip CHIP2 and the second stacked memory 100_1 may be coupled to each other through an interface circuit 130_1. The second stacked memory 100_1 may be coupled to each of the interface circuits 120_1 and 130_1 through a second shared bus 140_1 embedded therein.

The first and second stacked memories 100 and 100_1 may be electrically coupled to each other through the interface circuits 120, 130, 120_1, and 130_1 and the first and second shared buses 140 and 140_1. As a result, data may be communicated between the first chip CHIP1 and the second chip CHIP2 through the first and second stacked memories 100 and 100_1.

For example, data may transmitted from the first chip CHIP1 to the second stacked memory device 100_1 through the first stacked memory device 100, and then may be stored in a memory of the second stacked memory device 100_1. Data may be transmitted from the second chip CHIP2 to the first stacked memory device 100 through the second stacked memory device 100_1, and then may be stored in a memory of the first stacked memory device 100.

As described above, the memory system 10 according to the embodiment shown in FIG. 6 may include the first and second stacked memories 100 and 100_1 coupled to each other in the form of a chain. However, embodiments of the present disclosure are not limited thereto, and the number of a plurality of stacked memories that share data to make a plurality of chips communicate with each other may be increased.

Figure 7:
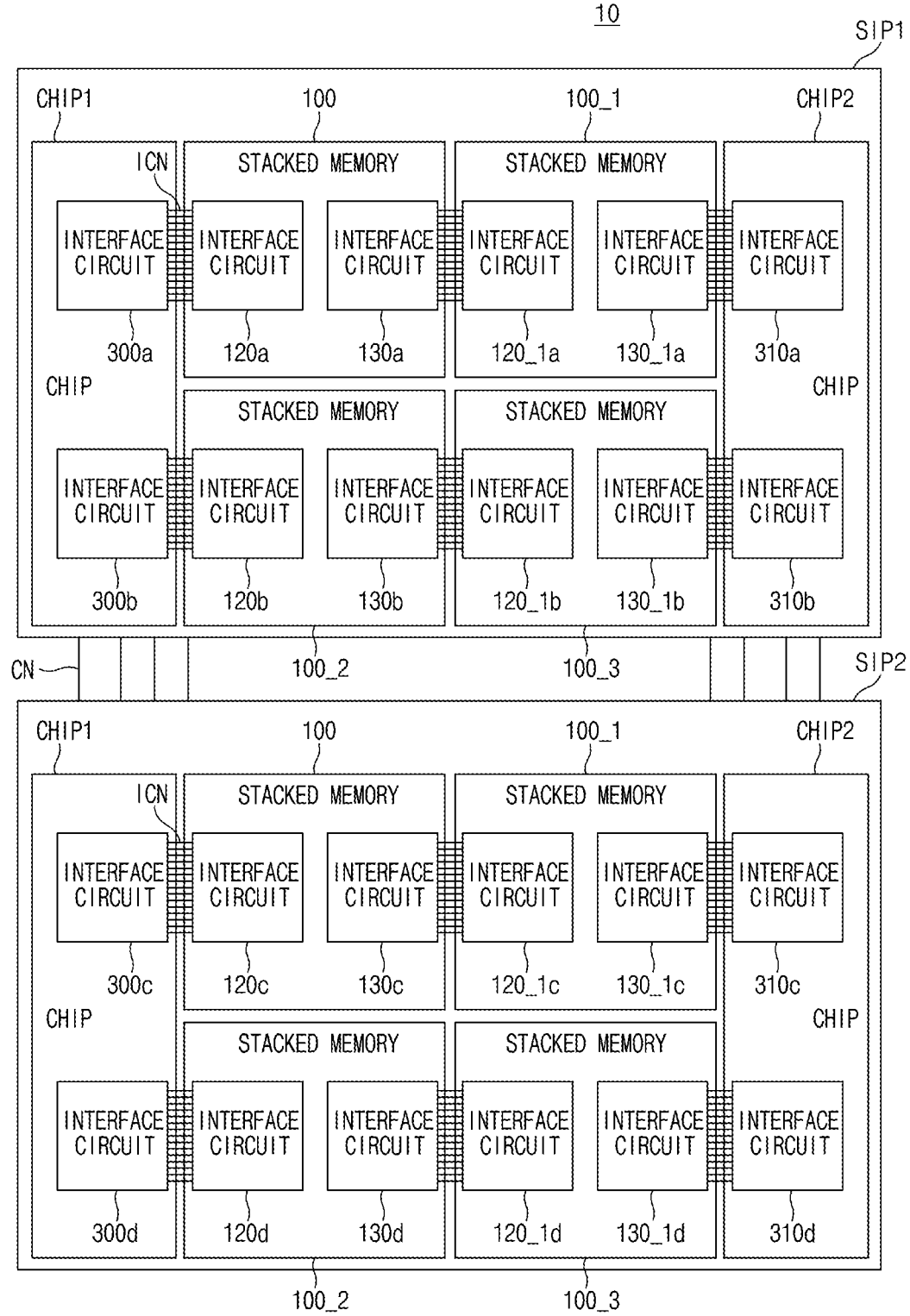
FIG. 7 illustrates a memory system according to still another embodiment of the present disclosure.

FIG. 7 illustrates a memory system 10 according to yet another embodiment of the present disclosure.

A plurality of memories may be integrated into a single package, and thus a single packaged product can operate at a high speed, process high-capacity data, and perform multi-functional operations. For example, System In Package (SIP) technology has been developed. In the SIP technology, microprocessor dies and memory dies can be implemented as a System In Package (SIP) using interposer interconnect technology.

The embodiment of FIG. 7 illustrates an example of a memory system 10 including at least one system-in-package (SIP). Referring to FIG. 7, the memory system 10 may include first and second system-in-packages (SIPs) SIP1 and SIP2. The first and second system-in-packages (SIPs) SIP1 and SIP2 shown in FIG. 7 are substantially identical in structure to each other, only the first system-in-package (SIP) SIP1 will be described hereinafter for convenience of description and better understanding of the present disclosure.

The first system-in-package SIP1 may include first, second, third, and fourth stacked memories (or stacked memory devices) 100~100_3 and first and second chips CHIP1 and CHIP2. Although the first system-in-package SIP1 according to the embodiment shown in FIG. 7 includes four stacked memories 100~100_3 for convenience of description, embodiments of the present disclosure are not limited thereto, and the number of stacked memories 100~100_3 may vary in other embodiments.

The stacked memories 100~100_3 may be disposed between the first chip CHIP1 and the second chip CHIP2. For example, the four stacked memories 100~100_3 may be arranged in row and column directions of a matrix.

The first and third stacked memories 100 and 100_2 may be disposed adjacent to the first chip CHIP1, and the first and third stacked memories 100 and 100_2 may be electrically coupled to interface circuit 300a and 300b of the first chip CHIP1 through interface circuits 120a and 120b, respectively. The second and fourth stacked memories 100_1 and 100_3 may be disposed adjacent to the second chip CHIP2, and the second and fourth stacked memories 100_1 and 100_3 may be electrically coupled to interface circuits 310a and 310b of the second chip CHIP2 through interface circuits 130_1a and 130_1b, respectively. The interface circuit 130a of the first stacked memory 100 and the interface circuit 130b of the third stacked memory 100_2 may be coupled to the interface circuit 120_1a of the second stacked memory 100_1 and the interface circuit 120_1b of the fourth stacked memory 100_3, respectively.

The interface circuits 300a, 300b, 310a, 310b, 120a, 120b, 130a, 130b, 120_1a, 120_1b 130_1a, and 130_1b included in the first and second chips CHIP1 and CHIP2 and the stacked memories 100~100_3 may be interconnected through an interposer channel ICN. For example, the interface circuit 300a of the first chip CHIP1 may be coupled to the interface circuit 120a of the first stacked memory 100 through one or more interpose channels ICN, the interface circuit 130a of the first stacked memory 100 may be coupled to the interface circuit 120_1a of the second stacked memory 100_1 through one or more interpose channels ICN, and the interface circuit 130_1a of the second stacked memory 100_1 may be coupled to the interface circuit 310a of the second chip CHIP2 through one or more interpose channels ICN. In an embodiment, the interposer channel ICN may correspond to each of the buses BUS1 and BUS2 shown in FIG. 2 or may also correspond to the interface channel 200.

The first system-in-package SIP1 and the second system-in-package SIP2 may be coupled to each other through one or more channels CN. In an embodiment, the channel CN through which the system-in-package SIP1 and the other system-in-package SIP2 are coupled to each other may be implemented using a Printed Circuit Board (PCB).

As is apparent from the above description, a memory system according to embodiments of the present disclosure includes a plurality of chips interconnected through a shared channel within a memory, such that a data transfer rate and data transfer efficiency may be increased and power consumption for data transmission may be reduced.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses may be possible.

What is claimed is:

1. A memory system comprising:
a first chip configured to perform a first operation;
a second chip configured to perform a second operation;
a stacked memory device configured to include a stacked structure of a plurality of memories, the stacked memory device being configured to be accessed by the first chip and the second chip through a shared bus;
a first interface circuit coupling the first chip to the shared bus; and
a second interface circuit coupling the second chip to the shared bus,
wherein the shared bus includes:
a first shared bus through which the first interface circuit and the second interface circuit are electrically coupled to each other; and
a second shared bus through which the first shared bus is coupled to the plurality of memories.

2. The memory system according to claim 1, wherein the stacked memory device includes at least one Through Silicon Via (TSV) coupling the plurality of memories.

3. The memory system according to claim 1, further comprising:
an interface channel disposed below the first chip, the second chip, and the buffer layer,
wherein the first interface circuit and the second interface circuit are included in a buffer layer.

4. The memory system according to claim 1, wherein:
the first shared bus extends in a first direction; and
the second shared bus extends in a second direction.

5. The memory system according to claim 4, wherein the second shared bus includes a plurality of lines that are arranged parallel to each other, the plurality of lines each extending in the second direction that is substantially perpendicular to the first direction.

6. The memory system according to claim 4, wherein the second shared bus is coupled to a bottom surface of an uppermost memory among the plurality of memories, and passes through the remaining ones of the plurality of memories.

7. The memory system according to claim 3, wherein the interface channel includes:
a first bus through which the first interface circuit and the first chip are coupled to each other; and
a second bus through which the second interface circuit and the second chip are coupled to each other.

8. The memory system according to claim 7, wherein the first chip includes a third interface circuit coupled to the first interface circuit through the first bus, and
wherein the second chip includes a fourth interface circuit coupled to the second interface circuit through the second bus.

9. The memory system according to claim 1, wherein the shared bus directly transmits data between the first chip and the second chip when neither the first chip nor the second chip accesses the plurality of memories.

10. The memory system according to claim 1, wherein the shared bus has a T-shape.

11. The memory system according to claim 1, wherein each of the first chip and the second chip is a System-on-Chip (SoC).

12. The memory system according to claim 1, wherein each of the plurality of memories includes:
a memory core configured to store data received through the shared bus;
a first buffer configured to buffer a signal received from the first chip and output a first buffered signal to the shared bus, and to buffer a signal received from the shared bus and output a second buffered signal to the first chip;
a second buffer configured to buffer a signal received from the second chip and output a third buffered signal to the shared bus, and to buffer a signal received from the shared bus and output a fourth buffered signal to the second chip; and
a third buffer configured to buffer at least one signal transmitted between the shared bus and the memory core.

13. The memory system according to claim 12, wherein the memory core includes:
a first chip allocation region configured to store data received from the first chip;
a second chip allocation region configured to store data received from the second chip; and
a common region configured to store data received from the first chip and the second chip.

14. The memory system according to claim 13, wherein, during a read operation of data, the memory core is configured to read the data from any one of the first chip allocation region, the second chip allocation region, and the common region.

15. The memory system according to claim 13, wherein:
the first chip transmits data to the memory core through the shared bus to store the transmitted data in the common region of the memory core;
the second chip reads the stored data in the common region, processes the read data, and transmits the processed data to the memory core through the shared bus to store the processed data in the second chip allocation region of the memory core; and
the first chip receives the stored data in the second chip allocation region through the shared bus.

16. The memory system according to claim 12, wherein each of the plurality of memories further includes:
a controller configured to control an access time at which one of the first chip and the second chip starts to access the memory core according to an operation state of the memory core.

17. The memory system according to claim 16, wherein the controller is configured to activate a busy signal when one or more of the first buffer, the second buffer, and the third buffer are operating.

18. The memory system according to claim 1, wherein the stacked memory device is a first stacked memory device, the system further comprising:
a second stacked memory device including a plurality of stacked memories, the first and second stacked memory devices being disposed between the first chip and the second chip, and
wherein the plurality of stacked memories of the second stacked memory device are electrically coupled to the first chip through the first and second shared buses and to the second chip through the second shared bus.

19. The memory system according to claim 18, wherein the first stacked memory device is electrically coupled to the first chip through a first interpose channel, the first stacked memory device is electrically coupled to the second stacked memory device through a second interpose channel, and the second stacked memory device is electrically coupled to the second chip through a third interposer channel.

* * * * *